(12) United States Patent
Yoshida

(10) Patent No.: US 10,169,494 B2
(45) Date of Patent: Jan. 1, 2019

(54) SLICE IMAGE CREATION DEVICE AND THREE-DIMENSIONAL PRINTING SYSTEM

(71) Applicant: Roland DG Corporation, Hamamatsu-shi, Shizuoka (JP)

(72) Inventor: Makoto Yoshida, Hamamatsu (JP)

(73) Assignee: ROLAND DG CORPORATION, Shizuoka (JP)

( * ) Notice: Subject to any disclaimer, the term of this patent is extended or adjusted under 35 U.S.C. 154(b) by 194 days.

(21) Appl. No.: 15/196,210

(22) Filed: Jun. 29, 2016

(65) Prior Publication Data

US 2017/0004227 A1   Jan. 5, 2017

(30) Foreign Application Priority Data

Jun. 30, 2015 (JP) .................................. 2015-131262

(51) Int. Cl.
| | |
|---|---|
| G06F 17/50 | (2006.01) |
| B29C 64/129 | (2017.01) |
| B29C 64/386 | (2017.01) |
| G06T 19/00 | (2011.01) |
| B33Y 50/02 | (2015.01) |
| B33Y 70/00 | (2015.01) |

(Continued)

(52) U.S. Cl.
CPC ............ *G06F 17/50* (2013.01); *B29C 64/129* (2017.08); *B29C 64/386* (2017.08); *G06T 19/00* (2013.01); *B29C 64/171* (2017.08); *B29C 64/393* (2017.08); *B33Y 50/02* (2014.12); *B33Y 70/00* (2014.12); *G05B 19/408* (2013.01); *G05B 19/4097* (2013.01); *G05B 19/4099* (2013.01); *G05B 19/41* (2013.01); *G05B 2219/35012* (2013.01); *G06T 2219/008* (2013.01)

(58) Field of Classification Search
CPC ..... G06F 17/50; B29C 64/386; B29C 64/393; B29C 64/171; B33Y 50/02; G05B 19/408; G05B 19/4097; G05B 19/4099; G05B 19/41; G05B 2219/35012
USPC ................. 264/162, 308; 700/118, 119, 120; 425/162, 174.4, 375
See application file for complete search history.

(56) References Cited

U.S. PATENT DOCUMENTS

| | | | |
|---|---|---|---|
| 6,215,493 B1 * | 4/2001 | Fujita | G06T 17/00 |
| | | | 345/418 |
| 6,259,962 B1 | 7/2001 | Gothait | |
| 2015/0029187 A1 * | 1/2015 | Nakamura | G06T 17/10 |
| | | | 345/420 |

FOREIGN PATENT DOCUMENTS

JP   2003-535712 A   12/2003

* cited by examiner

*Primary Examiner* — Seyed Masoud Malekzadeh
*Assistant Examiner* — Lawrence D. Hohenbrink, Jr.
(74) *Attorney, Agent, or Firm* — Keating & Bennett, LLP

(57) ABSTRACT

In a slice image creation device, a topology construction processor constructs a topology to create a topology list of a target object model. A division determination processor determines whether or not there is a ridgeline or an apex at which the target object model is divisible in correspondence with topology groups. A division processor, in a case that, for example, there is a ridgeline that is in contact with 4 planes, divides the target object model into at least a first divided object model and a second divided object model along the ridgeline that is in contact with 4 planes. A slice image creation processor creates a first divided slice image and a second divided slice image respectively corresponding to the first divided object model and the second divided (Continued)

object model. A synthesis processor synthesizes the first divided slice image and the second divided slice image to create a target slice image.

6 Claims, 14 Drawing Sheets

(51) Int. Cl.
*G05B 19/41* (2006.01)
*B29C 64/393* (2017.01)
*G05B 19/408* (2006.01)
*G05B 19/4097* (2006.01)
*B29C 64/171* (2017.01)
*G05B 19/4099* (2006.01)

US 10,169,494 B2

SLICE IMAGE CREATION DEVICE AND THREE-DIMENSIONAL PRINTING SYSTEM

CROSS REFERENCE TO RELATED APPLICATIONS

The present application claims priority to Japanese Patent Application No. 2015-131262 filed on Jun. 30, 2015, which is incorporated by reference herein in its entirety.

BACKGROUND OF THE INVENTION

1. Field of the Invention

The present invention relates to a slice image creation device and a three-dimensional printing system.

2. Description of the Related Art

Conventionally, a three-dimensional printing device that prints a desired three-dimensional object (hereinafter, referred to as a "target object") is known. This type of three-dimensional printing device uses, for example, a computer-aided design device (hereinafter, referred to also as a "CAD device") to create data of a three-dimensional model which is usable to print the target object (hereinafter, such a three-dimensional model will be referred to as a "target object model") (see, for example, Japanese PCT National-Phase Patent Publication No. 2003-535712). The target object model is sliced at a predetermined interval to create a plurality of two-dimensional slice models corresponding to cross-sectional shapes of the target object (hereinafter, such a two-dimensional slice model will be referred to as a "target slice model").

A target slice model is defined by a contour of the target object. The target slice model is divided into a printing region, which is to be printed, and a non-printing region, which is not to be printed, along the contour. Thus, for example, the printing region in the region of the target slice model is colored white and the non-printing region is colored black by the CAD device, so that a slice image (hereinafter, referred to as a "target slice image"), which is an image of the target slice model, is created. The slice image includes a contour that distinguishes the printing region and the non-printing region from each other. The slice image includes a multiplexed portion where, for example, a plurality of contours cross each other. The contour that distinguishes the printing region and the non-printing region from each other is one of the plurality of contours in the multiplexed portion. Extracting such a contour that distinguishes the printing region and the non-printing region from each other, among the plurality of contours, is referred to as "peeling". Usually, an outermost contour is the contour that distinguishes the printing region and the non-printing region from each other.

A three-dimensional printing device includes, for example, a table provided with an opening, a tank that is located on the table and accommodates a photocurable resin, a holder that is located above the tank and is movable up and down, and an optical device that is located below the table and outputs light. Light that is output from the optical device is directed toward the photocurable resin in the tank through the opening in the table. A portion of the photocurable resin, accommodated in the tank, that is irradiated with the light is cured. The position to be irradiated with the light is controlled to appropriately change the position in the photocurable resin to be cured, so that a portion of the photocurable resin located in the region colored white, in the target slice image, is cured whereas a portion of the photocurable resin located in the region colored black is not cured. As a result, a cross-sectional shape conformed to the target slice image is formed. The holder is sequentially moved up to continuously expand the resin layer downward. In this manner, a desired target object is printed.

There is a case where the target object to be printed is a combination of a plurality of singular objects (hereinafter, referred to as a "unit object") (such a combination will be referred to as a "whole object"). For example, FIG. 20A is a perspective view of a target object model 170 corresponding to the whole object (hereinafter, such a target object model will be referred to as a "whole object model 170"). FIG. 20B is a side view of the whole object model 170. As shown in FIG. 20A, the whole object model 170 is defined by contours of unit object models 170a, 170b and 170c corresponding to a plurality of unit objects. FIG. 21 shows a slice model 172 obtained as a result of slicing the whole object model 170 shown in FIG. 20B at position PT100 (hereinafter, such a slice model will be referred to as a "whole slice model 172"). As shown in FIG. 21, the whole slice model 172 is defined by contours 173a, 173b and 173c of the plurality of unit object models 170a, 170b and 170c, like the whole object model 170. The whole slice model 172 may include an intersection 184, at which the plurality of contours 173a, 173b and 173c cross each other.

Before a slice image of the whole slice image 172 (hereinafter, such a slice image will be referred to as a "whole slice image") is created, the CAD device or the like traces the contours of the whole slice image 172 to extract a contour showing the entirety of the whole slice model 172 and distinguishes a printing region and a non-printing region of the whole slice model 172 from each other (i.e., to perform peeling), among the plurality of contours 173a, 173b and 173c. For example, in a case that the CAD device traces the contour 173a as represented by the arrows on the contour 173a in FIG. 21, the CAD device transfers from the contour 173a to another contour at the intersection 184. However, at the intersection 184, there are a plurality of contours to which the CAD device may transfer. Specifically, at the intersection 184, there are two contours to which the CAD device may transfer, namely, the contour 173b and the contour 173c. Therefore, there is a risk that the CAD device may transfer to the contour 173b despite that the CAD device should transfer to the contour 173c. When this occurs, the CAD device does not perform the desired peeling for the whole slice model 172 correctly, and thus may not create a desired whole slice image. In a case that the desired whole slice image is not created, a desired whole object is not printed.

SUMMARY OF THE INVENTION

Preferred embodiments of the present invention provide a slice image creation device, usable for a three-dimensional printing device that prints a target object as a printing target, that obtains a desired slice image, and also provide a three-dimensional printing system.

A slice image creation device according to a preferred embodiment of the present invention is usable for a three-dimensional printing device that prints a target object as a printing target, and creates a target slice image usable to print the target object. The slice image creation device includes a storage processor configured or programmed to store a target object model as a three-dimensional model corresponding to the target object; a topology construction processor configured or programmed to find an adjacency relationship of apexes, ridgelines and planes defining the target object model to create a topology list indicating the adjacency relationship; a division determination processor configured or programmed to determine, from the topology list, whether or not there is a ridgeline, among the ridgelines of the target object model, that is in contact with 4 planes; a division processor configured or programmed to, in a case that the division determination processor determines that there is a ridgeline that is in contact with 4 planes, divide the target object model into at least a first divided object model and a second divided object model along the ridgeline that is in contact with 4 planes; a slice model creation processor configured or programmed to slice each of the first divided object model and the second divided object model at a predetermined interval to create a plurality of first divided slice models as slice models of the first divided object model and a plurality of second divided slice models as slice models of the second divided object model; a slice image creation processor configured or programmed to divide a region of each of the first divided slice models and each of the second divided slice models into a divided printing region to be printed by the three-dimensional printing device and a divided non-printing region not to be printed by the three-dimensional printing device to create a first divided slice image as an image of each of the first divided slice models and a second divided slice image as an image of each of the second divided slice models; and a synthesis processor configured or programmed to overlap each of the first divided slice images and a second divided slice image defining a same layer as the each of the first divided slice images, and determine, as a target printing region to be printed by the three-dimensional printing device, a portion of the overlap region corresponding to at least one of a printing region of the first divided slice image or a printing region of the second divided slice image and determine, as a target non-printing region not to be printed by the three-dimensional printing device, a portion of an overlap region corresponding to both of a non-printing region of the first divided slice image and a non-printing region of the second divided slice image, to create the target slice image.

With the above-described slice image creation device, the target object model having a ridgeline, among the ridgelines defining the target object model, that is in contact with "4" planes is a non-manifold model, which is not recognizable by a computer program as being three-dimensional. In a case that the target object model is a non-manifold model, the computer program does not recognize the target object model as being three-dimensional. Therefore, conventionally, a target slice image corresponding to the target object model is not created, and thus a desired target slice image is not created. However, in a case that, for example, there is a ridgeline along which the target object model is divisible in correspondence with the topology groups, the target object model is divisible into a plurality of divided object models (e.g., the first divided object model and the second divided object model) along the ridgeline. Specifically, the target object model is divided along the ridgeline which is in contact with "4" planes, so that the post-division models, namely, the first divided object model and the second divided object model, are manifold models, which are recognizable by the computer program as being three-dimensional. Therefore, the first divided slice image corresponding to the first divided object model and the second divided slice image corresponding to the second divided object model are created. Then the created first divided slice image and the created second divided slice image are synthesized to create the target slice image. This solves the problem with the conventional art that a contour of a desired target slice model is not extracted because peeling is not performed properly on the target object model. Therefore, with the slice image creation device, a desired target slice image is obtained.

Another slice image creation device according to a preferred embodiment of the present invention is usable for a three-dimensional printing device that prints a target object as a printing target, and creates a target slice image usable to print the target object. The slice image creation device includes a storage processor configured or programmed to store a target object model as a three-dimensional model corresponding to the target object; a topology construction processor configured or programmed to find an adjacency relationship of apexes, ridgelines and planes defining the target object model to create a topology list indicating the adjacency relationship; a division determination processor configured or programmed to determine whether or not a number of planes that are in contact with each of all of the ridgelines of the target object model is 2; a division processor configured or programmed to, in a case that the division determination processor determines that the number of planes that are in contact with each of all the ridgelines is 2, calculate a number of topology groups into which the topology list is divisible, and in a case that the topology list is divisible into a plurality of topology groups, divide the target object model into divided object models of the number of the topology groups, with any two of the divided object models being a first divided object model and a second divided object model, respectively; a slice model creation processor configured or programmed to slice each of the first divided object model and the second divided object model at a predetermined interval to create a plurality of first divided slice models as slice models of the first divided object model and a plurality of second divided slice models as slice models of the second divided object model; a slice image creation processor configured or programmed to divide a region of each of the first divided slice models and each of the second divided slice models into a divided printing region to be printed by the three-dimensional printing device and a divided non-printing region not to be printed by the three-dimensional printing device to create a first divided slice image as an image of each of the first divided slice models and a second divided slice image as an image of each of the second divided slice models; and a synthesis processor configured or programmed to overlap each of the first divided slice images and the second divided slice image defining a same layer as the each of the first divided slice images, and determine, as a target printing region to be printed by the three-dimensional printing device, a portion of an overlap region corresponding to at least one of a printing region of the first divided slice image or a printing region of the second divided slice image and determine, as a target non-printing region not to be printed by the three-dimensional printing device, a portion of an overlap region corresponding to both of a non-printing region of the first divided slice image and a non-printing region of the second divided slice image, to create the target slice image.

With the above-described slice image creation device, in a case that the number of the planes that are in contact with each of all of the ridgelines is "2" and there are a plurality of topology groups, the target object model is divisible into divided object models of the number of the topology groups. Therefore, for example, a first divided slice image corresponding to the post-division first divided object model and a second divided slice image corresponding to the post-division second divided object model are created, and the created first divided slice image and the created second divided slice image are synthesized to create a target slice image. This solves the problem with the conventional art that a contour of a desired target slice model is not extracted because peeling is not performed properly on the target object model. In addition, a desired target slice image is obtained.

Still another slice image creation device according to a preferred embodiment of the present invention is usable for a three-dimensional printing device that prints a target object as a printing target, and creates a target slice image usable to print the target object. The slice image creation device includes a storage processor configured or programmed to store a target object model as a three-dimensional model corresponding to the target object; a topology construction processor configured or programmed to find an adjacency relationship of apexes, ridgelines and planes defining the target object model to create a topology list indicating the adjacency relationship; a division determination processor configured or programmed to calculate a number of topology groups into which the topology list is divisible, and in a case that the topology list is divisible into a plurality of topology groups, determine whether or not there is an apex, among the apexes of the target object model, at which the target object model is divisible in correspondence with the topology groups; a division processor configured or programmed to, in a case that the division determination processor determines that there is an apex at which the target object model is divisible, divide the target object model into at least a first divided object model and a second divided object model at the apex; a slice model creation processor configured or programmed to slice each of the first divided object model and the second divided object model at a predetermined interval to create a plurality of first divided slice models as slice models of the first divided object model and a plurality of second divided slice models as slice models of the second divided object model; a slice image creation processor configured or programmed to divide a region of each of the first divided slice models and each of the second divided slice models into a divided printing region to be printed by the three-dimensional printing device and a divided non-printing region not to be printed by the three-dimensional printing device to create a first divided slice image as an image of each of the first divided slice models and a second divided slice image as an image of each of the second divided slice models; and a synthesis processor configured or programmed to overlap each of the first divided slice images and the second divided slice image defining a same layer as the each of the first divided slice images, and determine, as a target printing region to be printed by the three-dimensional printing device, a portion of an overlap region corresponding to at least one of a printing region of the first divided slice image or a printing region of the second divided slice image and determine, as a target non-printing region not to be printed by the three-dimensional printing device, a portion of the overlap region corresponding to both of a non-printing region of the first divided slice image and a non-printing region of the second divided slice image, to create the target slice image.

With the above-described slice image creation device, in a case that there are a plurality of topology groups of the target object model and there is an apex, among the apexes defining the target object model, at which the target object model is divisible in correspondence with the topology groups, the target object model is divisible into a plurality of divided object models at the apex. Therefore, for example, a first divided slice image corresponding to the post-division first divided object model and a second divided slice image corresponding to the post-division second divided object model are created, and the created first divided slice image and the created second divided slice image are synthesized to create a target slice image. This solves the problem with the conventional art that a contour of a desired target slice model is not extracted because peeling is not performed properly on the target object model. In addition, a desired target slice image is obtained.

In a preferred embodiment of the present invention, the first divided object model and the second divided object model are manifold models.

In the above-described preferred embodiment, the first divided object model and the second divided object model are manifold models, which are recognizable by a computer program as being three-dimensional. Therefore, the first divided slice image corresponding to the first divided object model and the second divided slice image corresponding to the second divided object model are created with more certainty.

In another preferred embodiment of the present invention, the slice image creation processor colors the divided printing region and the divided non-printing region with different colors from each other. The synthesis processor colors the target printing region and the target non-printing region with different colors from each other.

In the above-described preferred embodiment, in the first divided slice image, the second divided slice image and the target slice image, the printing region (divided printing region, and target printing region) and the non-printing region (divided non-printing region, and target non-printing region) are represented with different colors from each other. Therefore, the computation of obtaining the target slice image from the first divided slice image and the second divided slice image is a simple computation of merely comparing pixel values of the pixels. This facilitates the computation performed on the printing regions and the computation performed on the non-printing regions in the first divided slice image and the second divided slice image, which are pre-division slice images. In addition, unlike with the conventional complicated computation method of obtaining a target slice image by peeling performed on a slice model defined by a plurality of contours, a computation failure caused by peeling, which is easily caused in a multiplexed portion where a plurality of contours cross each other is avoided. Therefore, a better computation result is provided, and the amount of computation is decreased. The data capacity is also decreased. This shortens the processing time.

In still another preferred embodiment of the present invention, the slice image creation device further includes a pre-process processor configured or programmed to perform a smoothing process as a pre-process on the target object model stored in the storage processor. The topology construction processor creates the topology list from the target object model processed by the smoothing process performed by the pre-process processor.

In the above-described preferred embodiment, the pre-process processor performs the smoothing process on the target object model to decrease the amount of data of the target object model. This allows the topology construction processor, the division determination processor, the division processor, the slice model creation processor, the slice image creation processor and the synthesis processor to use the target object model having the amount of data decreased by the pre-process processor. This preferably decreases the computation load.

A three-dimensional printing system according to a preferred embodiment of the present invention includes the above-described three-dimensional printing device, and the slice image creation device according to any of the preferred embodiments of the present invention described above.

In the above-described preferred embodiment, a three-dimensional printing system including the slice image creation device according to any of the preferred embodiments of the present invention described above is provided.

According to a preferred embodiment of the present invention, a desired target slice image corresponding to a target object to be printed is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, three-dimensional printing systems including a slice image creation device according to preferred embodiments of the present invention will be described with reference to the drawings. The preferred embodiments of the present invention described below are not intended to limit the present invention to any specific preferred embodiment in any way. Elements and sites having identical functions bear identical reference signs, and the same descriptions may be omitted appropriately or simplified.

Preferred Embodiment 1

Figure 1:
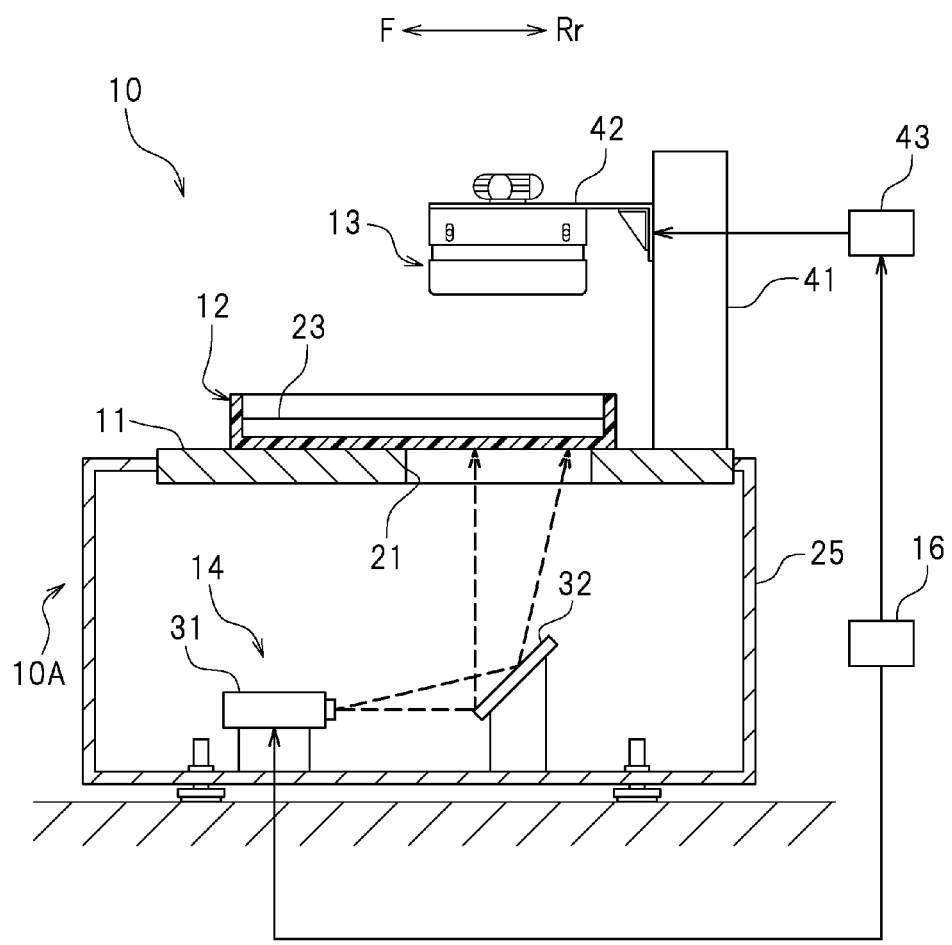
FIG. 1 is a cross-sectional view of a three-dimensional printing system according to preferred embodiment 1 of the present invention.
Figure 2:
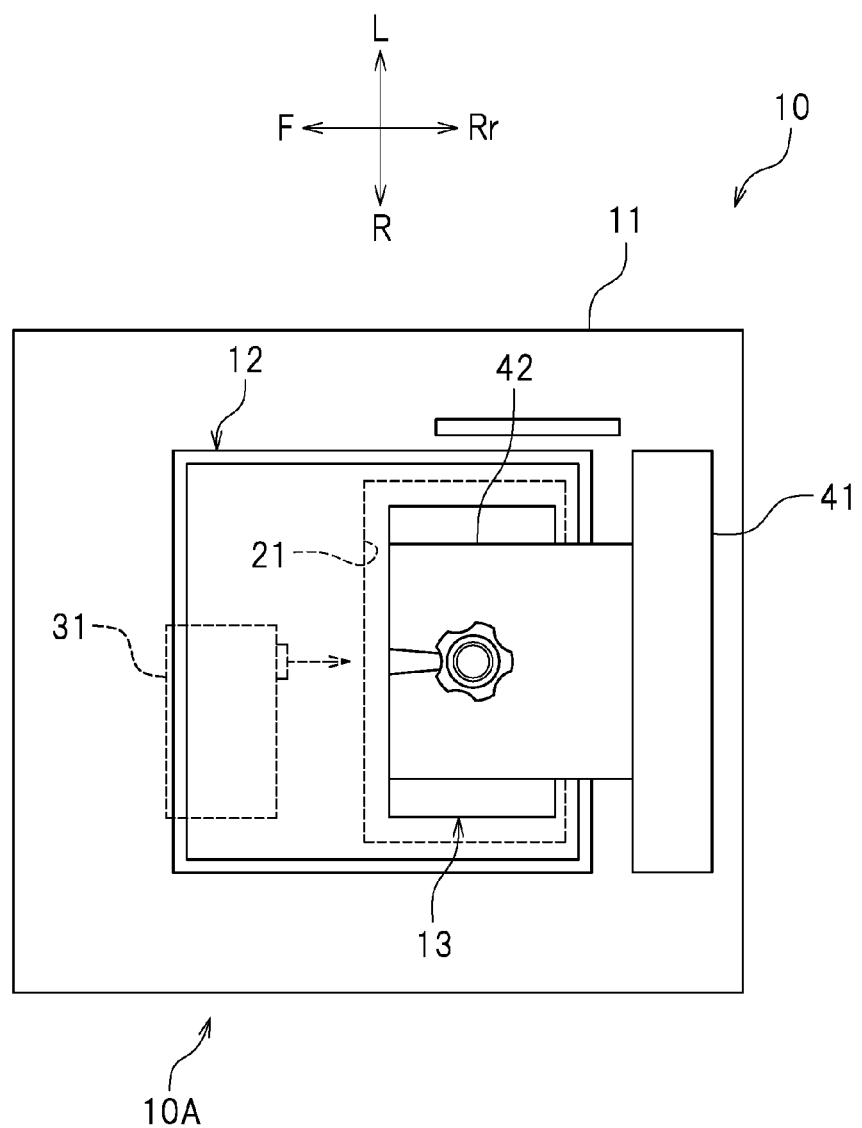
FIG. 2 is a plan view of the three-dimensional printing system.

FIG. 1 is a cross-sectional view of a three-dimensional printing system 10 in this preferred embodiment. FIG. 2 is a plan view of the three-dimensional printing system 10. In the drawings, letters F, Rr, L and R respectively represent front, rear, left and right. These directions are provided merely for the sake of convenience, and do not limit the form of installation of the three-dimensional printing system 10 in any way.

The three-dimensional printing system 10 is a system that prints a three-dimensional object. As shown in FIG. 1, the three-dimensional printing system 10 includes a three-dimensional printing device 10A and a slice image creation device 100 (see FIG. 5). A cross-sectional shape of a three-dimensional object is prepared in advance. The three-dimensional printing device 10A cures a photocurable resin in a liquid state to form a resin layer having a shape corresponding to a prepared cross-sectional shape of a three-dimensional object and sequentially stacks such resin layers to print the three-dimensional object. Herein, the term "cross-sectional shape" refers to the shape of a cross-section obtained as a result of slicing a three-dimensional object at a predetermined thickness (e.g., about 0.1 mm). A "photocurable resin" is a resin that is cured when being irradiated with light including a light component having a predetermined wavelength. The three-dimensional printing device 10A includes a table 11, a tank 12, a holder 13, an optical device 14, and a controller 16.

The table 11 is supported by a case 25. The table 11 is provided with an opening 21 through which light to be directed toward a photocurable resin 23 is allowed to pass. The tank 12 accommodates the photocurable resin 23 in a liquid state. The tank 12 is placed on the table 11 so as to be attachable to the table 11. As shown in FIG. 2, the tank 12 covers the opening 21 in the table 11 when being placed on the table 11. The tank 12 may be formed of a light-transmissive material, for example, a transparent material.

As shown in FIG. 1, the holder 13 is located above the tank 12 and above the opening 21 in the table 11. The holder 13 is movable up and down. When being moved down, the holder 13 is immersed in the photocurable resin 23 in the tank 12. When being moved up, the holder 13 pulls up the photocurable resin 23, which is cured as a result of being irradiated with light. In this example, the table 11 is provided with a column 41 extending in an up-down direction. A slider 42 is attached to the front of the column 41. The slider 42 is movable up and down along the column 41. The slider 42 is movable up and down by a motor 43. In this example, the holder 13 is attached to the slider 42. The holder 13 is located to the front of the column 41. The holder 13 is movable up and down by the motor 43.

The optical device 14 is located below the table 11. The optical device 14 directs light having a predetermined wavelength toward the photocurable resin 23 in a liquid state that is accommodated in the tank 12. The optical device 14 is accommodated in the case 25 provided below the table 11. The optical device 14 includes a projector 31 and a mirror 32. The projector 31 is a light source emitting light. The projector 31 is located below a front portion of the table 11.

The projector 31 is located to the front of the holder 13. A lens (not shown) is located to the rear of the projector 31. The projector 31 emits light in a front-to-rear direction via the lens. The mirror 32 reflects the light, emitted from the projector 31, toward the tank 12. The mirror 32 is located below the opening 21 formed in the table 11 and to the rear of the projector 31. The light emitted from the projector 31 is reflected by the mirror 32. The light reflected by the mirror 32 is directed toward the photocurable resin 23 in the tank 12 through the opening 21 in the table 11.

The controller 16 is connected with the motor 43 controlling the slider 42, having the holder 13 attached thereto, to be movable up and down, and is also connected with the projector 31 of the optical device 14. The controller 16 drives the motor 43 to move the slider 42 and the holder 13 upward or downward. The controller 16 controls the energy, luminosity, amount, wavelength band, and shape of the light emitted from the projector 31, the position in the photocurable resin 23 that is to be irradiated with the light, the timing to emit the light, and the like. There is no specific limitation on the structure of the controller 16. For example, the controller 16 may be a computer and may include a central processing unit (hereinafter, referred to as a "CPU") and a ROM, a RAM or the like storing a program or the like to be executed by the CPU.

The structure of the three-dimensional printing device 10A in this preferred embodiment has been described. For printing a target object, which is a printing target, by the three-dimensional printing device 10A, the CAD device or the like is used to create a target object model corresponding to the target object. The target object model is sliced at a predetermined interval to create a plurality of target slice models corresponding to cross-sections of the target object. In this example, the "target slice model" is STL data.

The target slice models are each divided into a printing region, which is to be printed, and a non-printing region, which is not to be printed. In this example, the printing region and the non-printing region are provided with different colors to create a target slice image of the target slice model. For example, the printing region is colored white whereas the non-printing region is colored black to create the target slice model.

The three-dimensional printing device 10A uses the created target slice image to control the position to which the light emitted from the projector 31 of the optical device 34 is to be directed. For example, the position of a portion of the photocurable resin 23 that is to be cured is appropriately changed, so that a portion of the photocurable resin 23 that is located in correspondence with the printing region is cured, whereas a portion of the photocurable resin 23 that is located in correspondence with the non-printing region is not cured. In this manner, a cross-section conformed to the target slice image is printed. The holder 13 is sequentially moved up to sequentially form cured resin layers in a downward direction. Thus, a desired target object is printed.

Figure 20A:
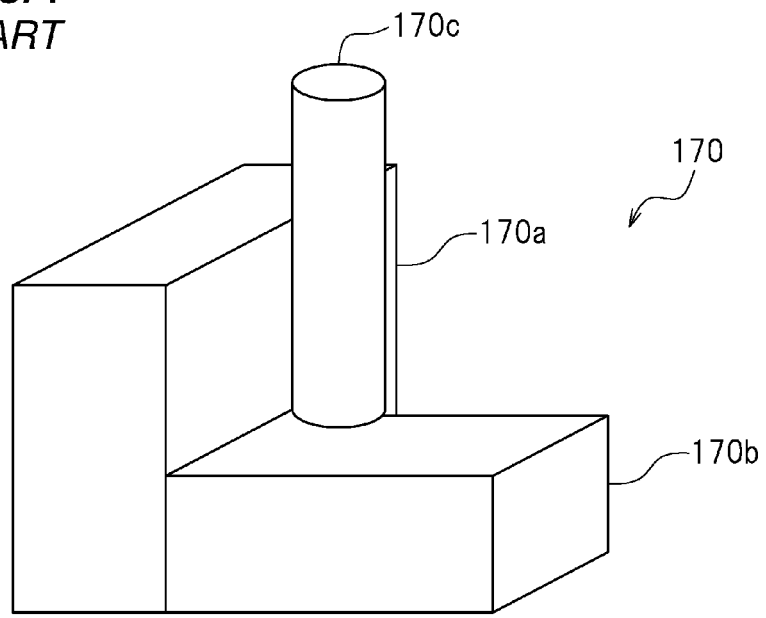
FIG. 20A is a perspective view of a whole object model by the conventional art.
Figure 20B:
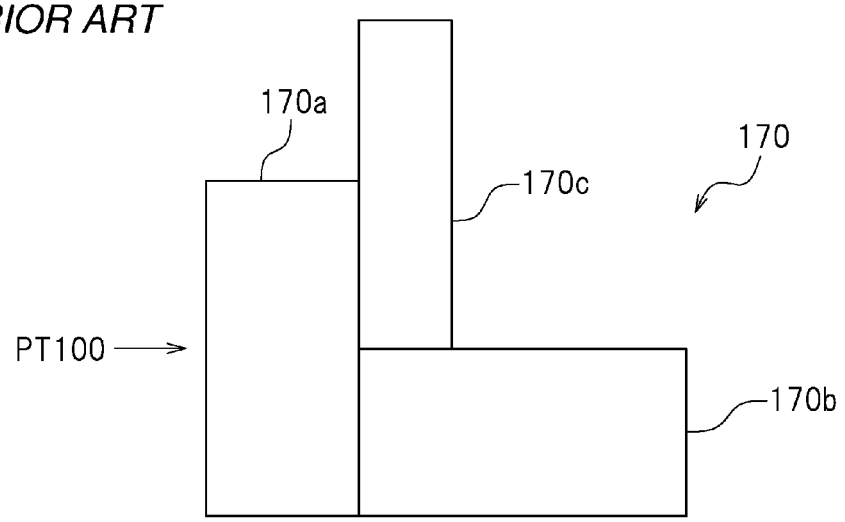
FIG. 20B is a side view of the whole object model by the conventional art.
Figure 21:
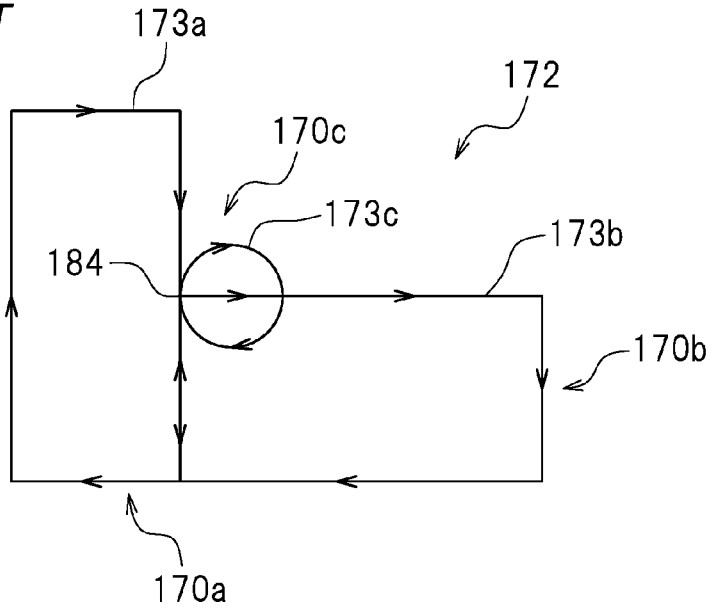
FIG. 21 shows a whole slice model obtained as a result of slicing the whole object model shown in FIG. 20A at position PT100.

The target object may be a whole object formed of a combination of a plurality of unit objects. As shown in FIG. 20A, the whole object model 170 corresponding to such a whole object is defined by the contours of the unit object models 170a, 170b and 170c of the plurality of unit objects. As shown in FIG. 21, the whole slice model 172 obtained as a result of slicing the whole object model 170 at position PT100 is defined by the plurality of contours 173a, 173b and 173c, like the whole object model 170. For example, the whole object model 172 may include the intersection 184, at which the plurality of contours 173a, 173b and 173c cross each other.

Conventionally, before a whole slice image, which is a slice image of the whole slice model 172, is created, the CAD device or the like traces the contours of the whole slice model 172. The contours of the whole slice model 172 are traced to perform peeling, namely, to extract a contour that shows the entirety of the whole slice model 172 and distinguishes a printing region and a non-printing region from each other, among the plurality of contour 173a, 173 and 173c. For example, in a case that the CAD device traces the contour 173a as represented by the arrows on the contour 173a shown in FIG. 21, the CAD device transfers from the contour 173a to another contour at the intersection 184. However, at the intersection 184, there are a plurality of contours to which the CAD device may transfer. Specifically, at the intersection 184, there are two contours to which the CAD device may transfer, namely, the contour 173b and the contour 173c. Therefore, there is a risk that the CAD device may transfer to the contour 173b despite that the CAD device should transfer to the contour 173c. When this occurs, the CAD device does not perform the peeling for the whole slice model 172 correctly, and thus may not create a desired whole slice image. In a case that the desired whole slice image is not created, a desired whole object is not printed.

In such a situation, in this preferred embodiment, the slice image creation device 100 uses another technique to obtain a desired slice image.

In a computer program, a target object model is recognized as a model of one object. Thus, the present inventor has discovered that a topology may be reconstructed for the target object to appropriately divide the target object model on a computer program. Herein, three-dimensional models, which are unit objects obtained as a result of the division performed by the reconstruction of the topology will be each referred to as a "divided object model". The reconstruction of the topology will be described below in detail. The present inventor has discovered that a plurality of slice models and a plurality of slice images may be created for each divided object model (the plurality of slice models created for each divided object model will be referred to as a "divided slice model"; and the plurality of slice images created for each divided object model will be referred to as a "divided slice image") and then the divided slice images forming the same layer may be synthesized to create a plurality of target slice images of the target object model. Herein, the expression that "the plurality of divided slice images are synthesized" indicates that the plurality of divided slice images are overlapped with each other. The technique of creating a target slice image in this preferred embodiment may be used to create a desired target slice image without the above-described problem.

Figure 3:
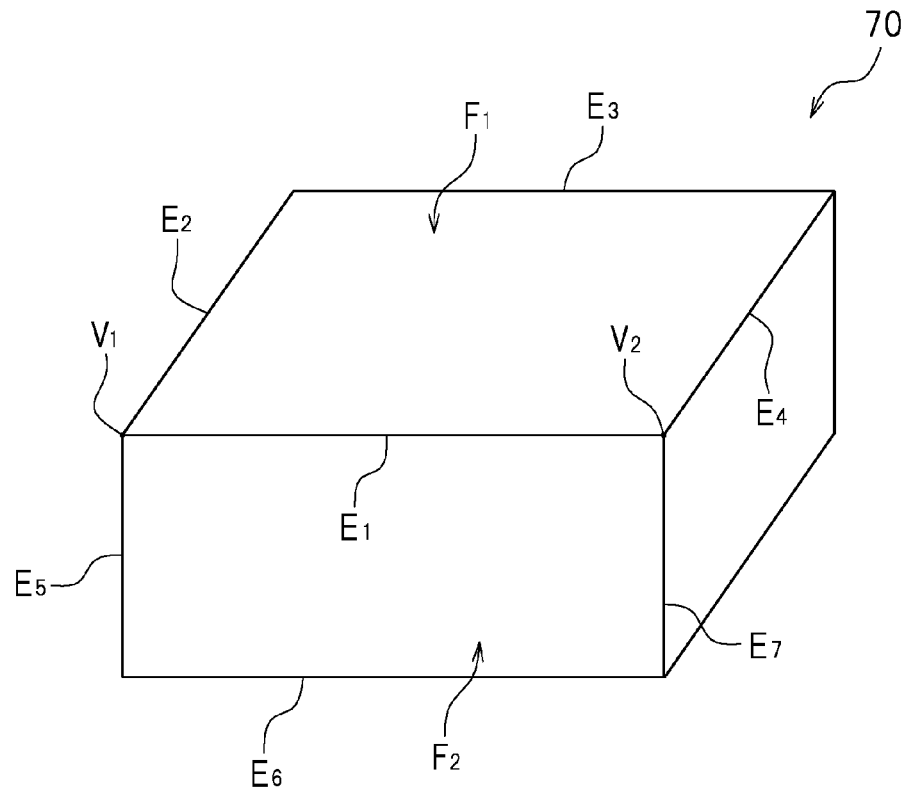
FIG. 3 shows an example of target object model, and is a perspective view of the target object model.

Now, the "reconstruction of the topology" will be described. FIG. 3 shows an example of target object model 70, and is a perspective view of the target object model 70. As shown in FIG. 3, the target object model 70 is defined by apexes, ridgelines, and planes. The ridgelines are each a line connecting an apex and another apex to each other. The planes are each enclosed by ridgelines. In the example shown in FIG. 3, ridgeline $E_1$ is a line connecting apex $V_1$ and apex $V_2$. Plane $F_1$ is enclosed by ridgelines $E_1$ through $E_4$. Herein, letter V with a numeral represents an apex. Letter E with a numeral represents a ridgeline. Letter F with a numeral represents a plane. Herein, the topology shows the relationship as to which of the apexes, ridgelines and planes are adjacent to each other. Hereinafter, such a relationship will be referred to as the "adjacency relationship of the apexes, ridgelines and planes". The target object model 70 may be considered to be in a state where the topology has already been constructed. In this preferred embodiment, the adjacency relationship of the apexes, ridgelines and planes of the target object model 70, for which the topology has already been constructed, is reconstructed, so that the relationship is clarified. In this preferred embodiment, the "reconstruction of the topology" refers to reconstructing the adjacency relationship of the apexes, ridgelines and planes.

Figure 4:
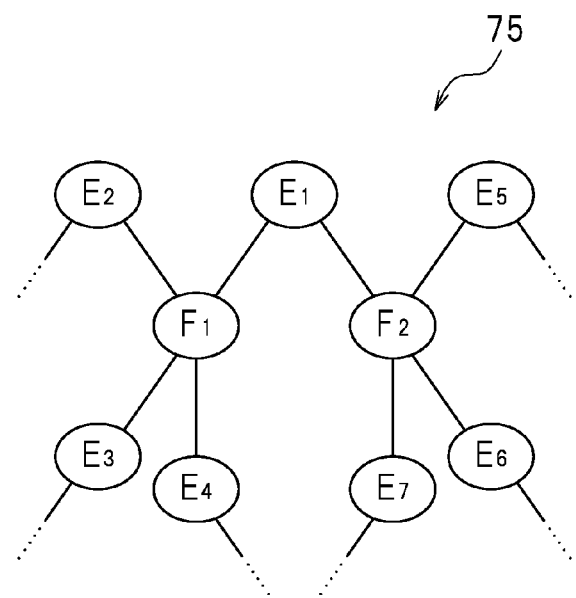
FIG. 4 shows a topology list of the target object model shown in FIG. 3.

When the topology is reconstructed, a list is created that shows the adjacency relationship of the apexes, ridgelines and planes. Herein, a list that shows the adjacency relationship of the apexes, ridgelines and planes is referred to as a "topology list". For example, FIG. 4 shows a topology list 75 of the target object model 70 shown in FIG. 3. FIG. 4 shows the topology list 75 showing the adjacency relationship of the ridgelines and planes. As shown in FIG. 4, the topology list 75 is represented by, for example, a tree structure. For example, in the topology list 75, ridgeline $E_1$ is in contact with planes $F_1$ and $F_2$. In the topology list 75, plane $F_1$ is in contact with ridgelines $E_1$ through $E_4$. Plane $F_2$ is in contact with ridgelines $E_1$ and $E_5$ through $E_7$.

It may be determined by the reconstruction of the topology whether the target object model is a manifold model or a non-manifold model. Herein, the "manifold model" refers to a model recognizable by a computer program as being three-dimensional. The "non-manifold model" refers to a model not recognizable by a computer program as being three-dimensional. In the case of a manifold model, the target object model is recognizable as being three-dimensional on a computer program. Therefore, it is possible to create a target slice image of the target object model. The target object model 70 shown in FIG. 3 is a manifold model, and thus it is possible to create a desired target slice image of the target object model 70.

However, in the case of a non-manifold model, the target object model is recognized by a computer program as being not three-dimensional. Therefore, there is an undesirable possibility that a target slice image may not be created properly. The present inventor has discovered that even in a case that the target object model is a non-manifold model, the target object model may be divided to allow the computer program to recognize that the target object model is a model that is a combination of a plurality of manifold divided object models. The present inventor has discovered that even in a case that the target object model is a non-manifold model, target slice images corresponding to the plurality of divided object models may be properly created. A method for determining whether the target object is a manifold model or a non-manifold model will be described below in detail. In which case a target object model that is a non-manifold model may be divided into a plurality of divided object models will be described below in detail.

Figure 5:
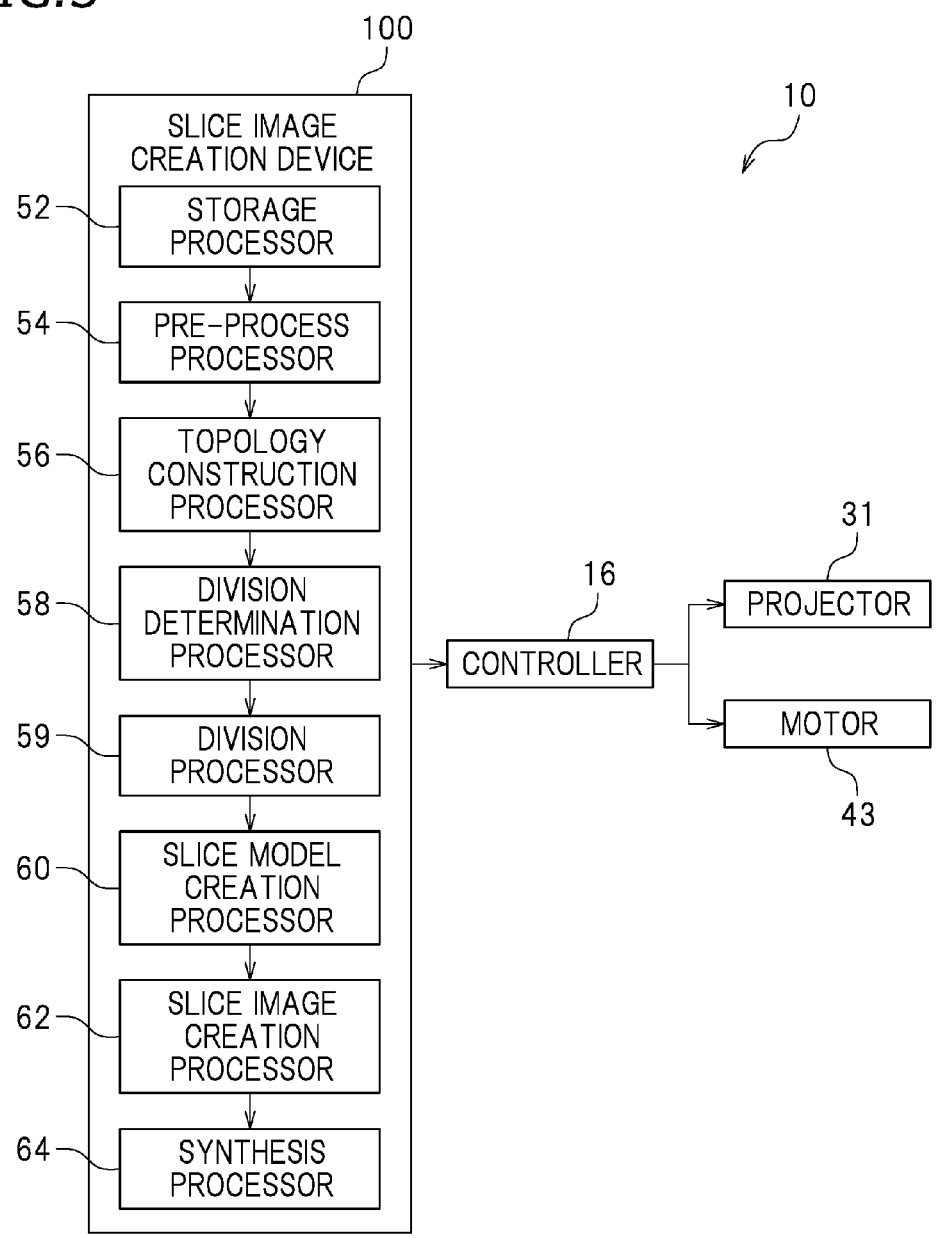
FIG. 5 is a block diagram of the three-dimensional printing system.

Now, the slice image creation device 100 will be described. FIG. 5 is a block diagram of the slice image creation device 100. The slice image creation device 100 may be separate from the three-dimensional printing device 10A, or may be built in the three-dimensional printing device 10A. The slice image creation device 100 may be, for example, a computer and may include a CPU, and a ROM, a RAM or the like storing a program or the like to be executed by the CPU. In this example, a program stored on the computer is used to create a target slice image. The slice image creation device 100 is connected with the controller 16 of the three-dimensional printing device 10A. The slice image creation device 100 may be a computer dedicated for the three-dimensional printing system 10 or a general-purpose computer.

As shown in FIG. 5, the slice image creation device 100 includes a storage processor 52, a pre-process processor 54, a topology construction processor 56, a division determination processor 58, a division processor 59, a slice model creation processor 60, a slice image creation processor 62, and a synthesis processor 64. These processors may be implemented by execution of a computer program (hereinafter, referred to as a "program") stored on the slice image creation device 100.

Figure 6:
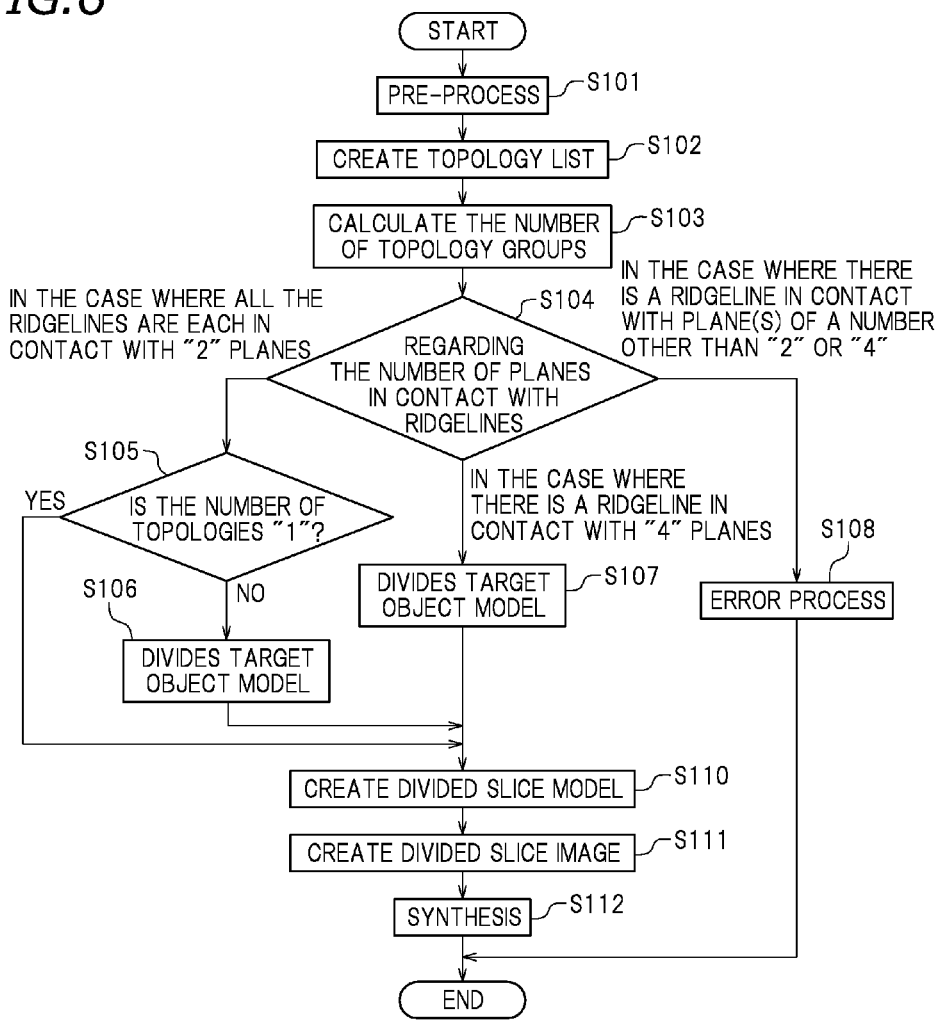
FIG. 6 is a flowchart showing a procedure of creating a target slice image.
Figure 7:
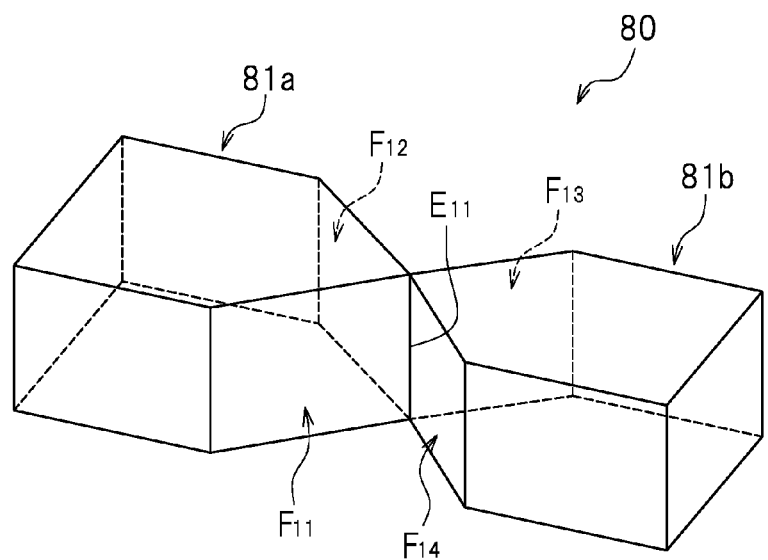
FIG. 7 shows an example of target object model, and is a perspective view of the target object model.

FIG. 6 is a flowchart showing a procedure of creating a target slice image. FIG. 7 shows an example of target object model 80, and is a perspective view of the target object model 80. In this example, a procedure of dividing the target object model 80 shown in FIG. 7 into a plurality of divided object models, and then creating target slice images of the plurality of divided object models will be described with reference to the flowchart shown in FIG. 6.

In this example, data of the target object model 80 corresponding to the target object is stored in the storage processor 52 in advance. The data of the target object model 80 is, for example, read onto the storage processor 52 from a storage medium or another computer (not shown) by an operation made by the user. The target object model 80 is specified by, for example, a set of a plurality of points on an XYZ orthogonal coordinate system, and is a three-dimensional model. The target object model 80 reproduces the target object by a combination of a plurality of polygons.

First, in step S101, the pre-process processor 54 performs a pre-process on the target object model 80 stored in the storage processor 52. The target object model 80 is often detailed data loyally reproducing a three-dimensional shape of the target object, which is a printing target. If the target object model is used as it is, the process of creating a target slice image 86 performed by the slice image creation device 100 may require a huge amount of time. Therefore, it is preferable that the pre-process processor 54 performs a pre-process on the target object model 80 to decrease the amount of data of the target object model 80. In this example, the pre-process processor 54 performs a smoothing process on the target object model 80. The smoothing process may be, for example, to decrease the number of polygons defining the target object model 80 to decrease the amount of data. There is no specific limitation on the method for the smoothing process. For example, a conventionally known method for the smoothing process may be used. For example, the Gaussian function may be used for the smoothing process. In this example, the data of the post-smoothing process target object model 80 is stored in the storage processor 52. The pre-process in step S101 may be omitted.

Next, in step S102, the topology construction processor 56 performs topology reconstruction on the target object model 80. Specifically, in this example, the topology construction processor 56 reconstructs the adjacency relationship of the apexes, ridgelines and planes to create a topology list 90 shown in FIG. 8.

Figure 8:
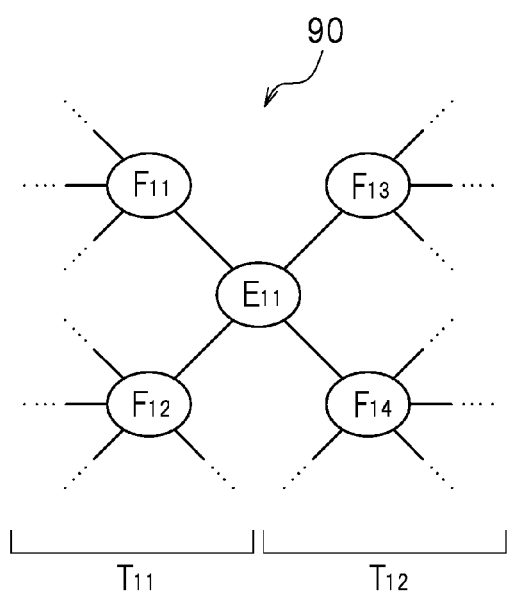
FIG. 8 shows a topology list of the target object model shown in FIG. 7.

Next, in step S103, the division determination processor 58 calculates the number of topology groups from the topology list 90 of the target object model 80. Herein, a topology list of a model which is a candidate for the division is one topology list. For example, the topology list 90 shown in FIG. 8 is divisible into two topology groups $T_{11}$ and $T_{12}$ along ridge line $E_{11}$. Therefore, the number of the topology groups of the target object model 80 is "2".

Next, in step S104, the division determination processor 58 determines whether or not the target object model 80 is divisible into a plurality of divided object models. In step S104, first, the ridgelines defining the target object model 80 will be paid attention to. In this example, first, the division determination processor 58 calculates the number of the planes that are in contact with each of the ridgelines defining the target object model 80. Then, in a case that the number of the planes that are in contact with each of all the ridgelines defining the target object model 80 is "2", the division determination processor 58 determines that the target object model 80 is a manifold model. Next, the procedure advances to step S105. In the case of, for example, the target object model 70 shown in FIG. 3, the number of the planes that are in contact with each of all the ridgelines defining the target object model 70 is "2". Therefore, the target object model 70 is a manifold model. In this case, the procedure advances to step S105.

In step S105, the division determination processor 58 determines the number of the topology groups. In a case that the number of the topology groups is "1", the target object model is not divisible. Therefore, the procedure advances to step S110 with no division of the target object model. In the case of, for example, the target object model 70 shown in FIG. 3, the number of the topology groups is "1" as shown in FIG. 4. In this case, the procedure advances to step S110 with no division of the target object model 70.

Figure 9:
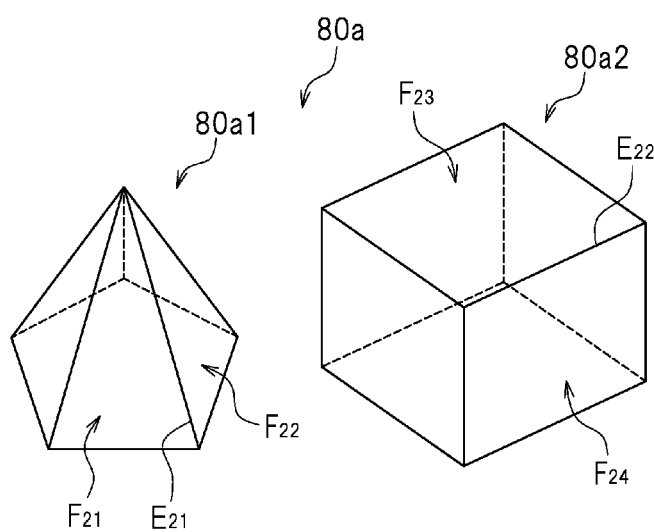
FIG. 9 shows an example of target object model, and is a perspective view of the target object model.
Figure 10:
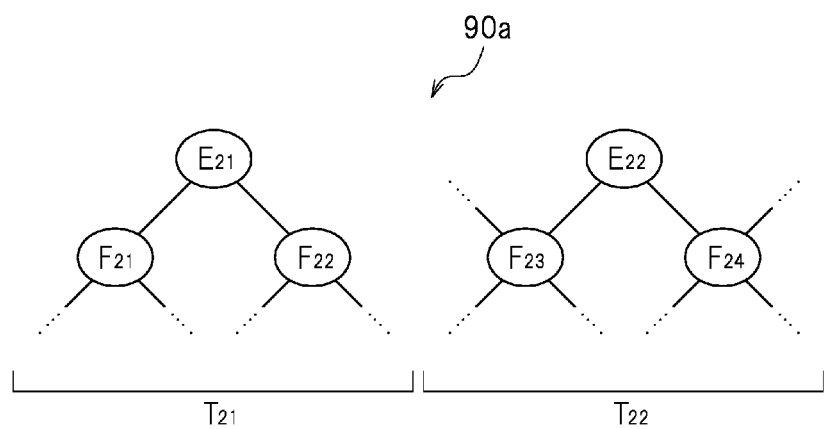
FIG. 10 shows a topology list of the target object model shown in FIG. 9.

In a case that in step S105, the number of the topology groups is other than "1", namely, in a case that there are a plurality of topology groups, the procedure advances to step S106. In step S106, the division processor 59 divides the target object model into divided object models of the number of the topology groups, considering that each of the topology groups is represented by a divided object model. For example, FIG. 9 shows an example of target object model 80$a$, and is a perspective view of the target object model 80$a$. FIG. 10 shows a topology list 90$a$ of the target object model 80$a$ shown in FIG. 9. In the case of the target object model 80$a$ shown in FIG. 9, there are two topology groups $T_{21}$ and $T_{22}$ as shown in FIG. 10. The number of the topology groups is "2". In this case, the division processor 59 divides the target object model 80$a$ into a divided object model 80$a$1 representing the topology group 121 and a divided object model 80$a$2 representing the topology group 122. Then, the procedure advances to step S110.

As shown in FIG. 6, the division determination processor 58 may determine in step S104 that there is a ridgeline, among the ridgelines defining the target object model, that is in contact with "4" planes. In this case, the division determination processor 58 determines that the target object model is a non-manifold model but may be divided into a plurality of divided object models to be made printable. In the case of, for example, the target object model 80 shown in FIG. 7, ridgeline $E_{11}$ is in contact with planes $F_{11}$, $F_{12}$, $F_{13}$ and $F_{14}$ as shown in FIG. 8. In this case, the target object model 80 is a non-manifold model, but may be divided into a plurality of divided object models to be made printable. In this case, the procedure advances to step S107.

Figure 11:
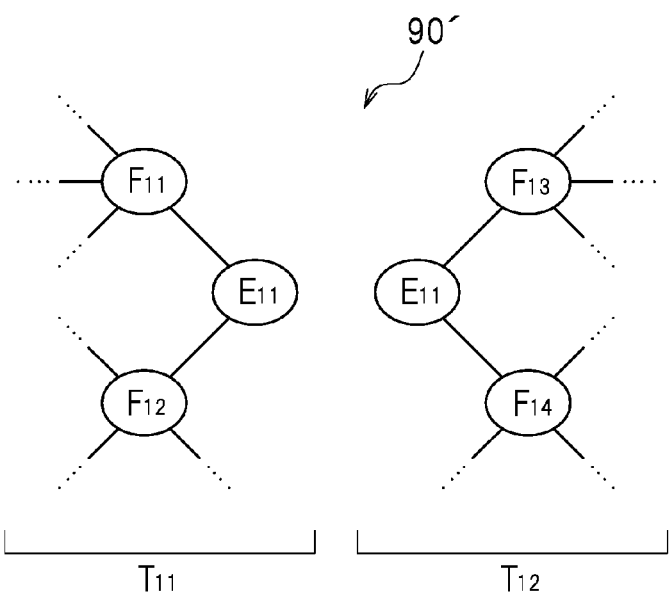
FIG. 11 shows a topology list obtained after the target object model shown in FIG. 7 is divided.

In step S107, the division processor 59 divides the target object model into two divided object models along the ridgeline that is in contact with the four planes. In the case of, for example, the target object model 80 shown in FIG. 7, the division processor 59 divides the target object model 80 into a divided object model 81$a$ and a divided object model 81$b$ along a ridgeline $E_{11}$ in contact with the four planes $F_{11}$, $F_{12}$, $F_{13}$ and $F_{14}$ as shown in FIG. 8. FIG. 11 shows a topology list 90' of the post-division target object model 80. As shown in FIG. 11, the topology group $T_{11}$ shows the divided object model 81$a$ shown in FIG. 7. The topology group $T_{12}$ shows the divided object model 81$b$ shown in FIG. 7. After the division, the procedure advances to step S110.

Figure 12:
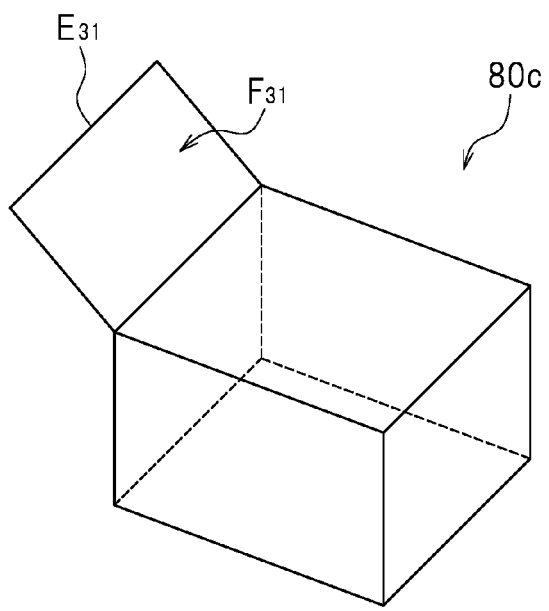
FIG. 12 shows an example of target object model, and is a perspective view of the target object model.

As shown in FIG. 6, the division determination processor 58 may determine in step S104 that there is a ridgeline, among the ridgelines defining the target object model, that is in contact with plane (s) of a number other than "2" or "4". In this case, the procedure advances to step S108. For example, FIG. 12 shows an example of target object model 80$c$, and is a perspective view of the target object model 80$c$. In the case of the target object model 80$c$ shown in FIG. 12, ridgeline $E_{31}$ is in contact with only plane $F_{31}$, and the number of the planes in contact with ridgeline $E_{31}$ is "1". In this case, the procedure advances to step S108.

In step S108, the division determination processor 58 determines that the target object model 80$c$ is a non-manifold model and is not divisible. In this case, the division determination processor 58 determines that the target object model 80$c$ is not printable, and performs an error process. Thus, the procedure is terminated. The slice image creation device 100 may display an error message to the user as the error process.

Figure 13:
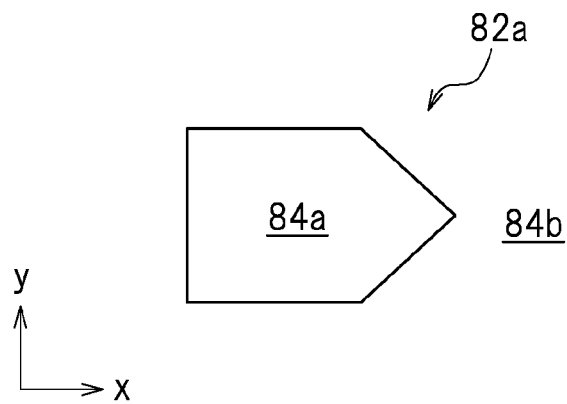
FIG. 13 shows an example of first divided slice model.
Figure 14:
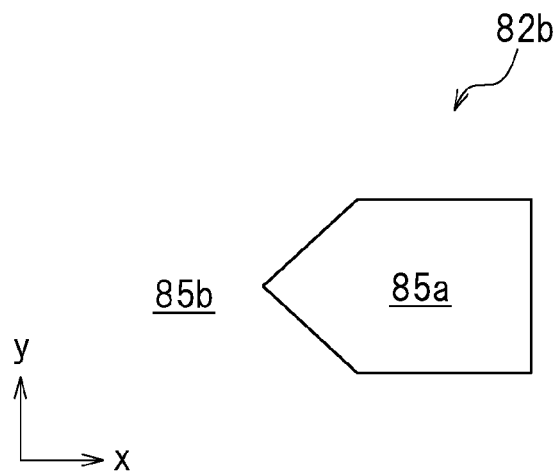
FIG. 14 shows an example of second divided slice model.

After the target object model is divided as described above, the target slice image is created in steps S110 through S112. First, in step S110, the slice model creation processor 60 creates a plurality of slice models from the divided object models obtained as a result of the division. For example, the target object model 80 shown in FIG. 7 is divided in step S107 into the divided object model 81$a$ (hereinafter, referred to as a "first divided object model 81$a$") and the divided object model 81$b$ (hereinafter, referred to as a "second divided object model 81$b$") by the division processor 59. The slice model creation processor 60 slices each of the first divided object model 81$a$ and the second divided object model 81$b$ at a predetermined interval to create a plurality of divided slice models corresponding to the first divided object model 81$a$ (hereinafter, referred to as "first divided slice models 82$a$") and a plurality of divided slice models corresponding to the second divided object model 81$b$ (hereinafter, referred to as "second divided slice model 82$b$"). FIG. 13 shows an example of first divided slice model 82$a$. FIG. 14 shows an example of second divided slice model 82$b$. In this example, the predetermined interval is a value stored in the storage processor 52 in advance. There is no specific limitation on the direction in which the divided object models are sliced. The direction may be, for example, a left-right direction or an up-down direction. The first divided object model 81$a$ and the second divided object model 81$b$ are sliced in the same direction.

Next, in step S111, the slice image creation processor 62 performs image conversion on each of the first divided slice models 82$a$ created in step S110 to create a divided slice image 83$a$ (hereinafter, referred to as a "first divided slice image 83$a$") shown in FIG. 15. Similarly, the slice image creation processor 62 performs image conversion on each of the second divided slice models 82$b$ to create a divided slice image 83$b$ (hereinafter, referred to as a "second divided slice image 83$b$") shown in FIG. 16. In this preferred embodiment, the first divided slice image 83$a$ and the second divided slice image 83$b$ are created by the same procedure. Therefore, in this example, the procedure of creating the first divided slice image 83$a$ will be described, and the procedure of creating the second divided slice image 83$b$ will be omitted.

The slice image creation processor 62 converts the first divided slice model 82$a$ shown in FIG. 13 into a binary image. On a computer, an image is an assembly of pixels.

The slice image creation processor 62 determines whether each of pixels in the first divided slice model 82*a* is in a printing region 84*a* to be printed or a non-printing region 84*b* not to be printed. For example, as shown in FIG. 15, for the first divided slice model 82*a*, the slice image creation processor 62 colors the pixels in the printing region 84*a* white and colors the pixels in the non-printing region 84*b* black to create the first divided slice image 83*a*. Similarly, as shown in FIG. 16, for the second divided slice model 82*b*, the slice image creation processor 62 colors the pixels in a printing region 85*a* white and colors the pixels in a non-printing region 85*b* black to create the second divided slice image 83*b*. In each of FIG. 15 and FIG. 16, the hatched region represents the region colored black. In this preferred embodiment, the printing regions 84*a* and 85*a* each correspond to the "divided printing region", and the non-printing regions 84*b* and 85*b* each correspond to the "divided non-printing region".

Next, in step S112, the synthesis processor 64 synthesizes the first divided slice image 83*a* and the second divided slice image 83*b* to create the target slice image 86 (see FIG. 17) of the target object model 80. In this example, the synthesis processor 64 extracts one first divided slice image 83*a* among the plurality of divided slice images created by the slice image creation processor 62 and extracts the second divided slice image 83*b* forming the same layer as the extracted first divided slice image 83*a*.

The synthesis processor 64 synthesizes the extracted first divided slice image 83*a* and the extracted second divided slice image 83*b* to create the target slice image 86. The first divided slice image 83*a* and the second divided slice image 83*b* may be synthesized, for example, as follows. First, the synthesis processor 64 overlap the extracted first divided slice image 83*a* and the extracted second divided slice image 83*b* such that coordinates thereof corresponding to each other match each other.

Next, the synthesis processor 64 makes a determination on the overlap region as follows. In the overlap region, a portion corresponding to the printing region 84*a* of the first divided slice image 83*a* or the printing region 85*a* of the second divided slice image 83*b* is determined as a printing region 86*a* of the target slice image 86. In other words, in the overlap region, a portion corresponding to at least one of the printing region 84*a* of the first divided slice image 83*a* or the printing region 85*a* of the second divided slice image 83*b* is determined as the printing region 86*a* of the target slice image 86.

Figure 17:
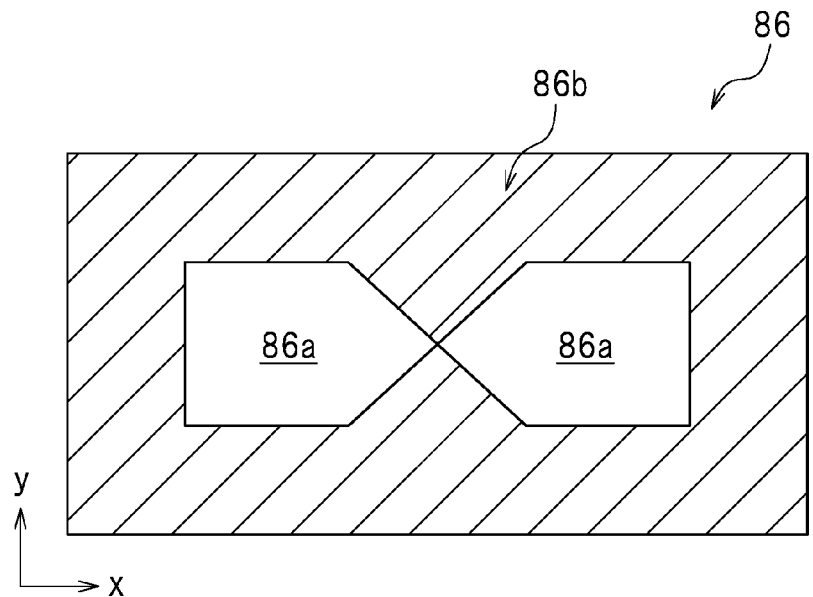
FIG. 17 shows a target slice image.

By contrast, in the overlap region, a portion corresponding to both of the non-printing region 84*b* of the first divided slice image 83*a* and the non-printing region 85*b* of the second divided slice image 83*b* is determined as a non-printing region 86*b* of the target slice image 86. Then, the synthesis processor 64 colors the pixels in the printing region 86*a* white and colors the pixels in the non-printing region 86*b* black to create the target slice image 86 shown in FIG. 17. In FIG. 17, the hatched region represents the region colored black. In this preferred embodiment, the printing regions 86*a* corresponds to the "target printing region" according to a preferred embodiment of the present invention, and the non-printing region 86*b* corresponds to the "target non-printing region" according to a preferred embodiment of the present invention.

The three-dimensional printing device 10A prints the target object conformed to the target slice image 86 created as described above. For example, the target slice image 86 shown in FIG. 17 is used to print a cross-sectional shape corresponding to the target slice image 86. Specifically, a portion of the photocurable resin 23 located in a region corresponding to the white region, namely, the printing region 86*a*, is irradiated with light emitted from the projector 31, so that the portion of the photocurable resin 23 located in the region corresponding to the printing region 86*a* is cured. By contrast, a portion of the photocurable resin 23 located in a region corresponding to the black region, namely, the non-printing region 86*b*, is not irradiated with light emitted from the projector 31, so that nothing is printed in the region corresponding to the non-printing region 86*b*.

As described above, in this preferred embodiment, the target object model 80 shown in FIG. 7 having ridgeline $E_{11}$ in contact with "4" planes is a non-manifold model, which is not recognizable by a computer program as being three-dimensional. In a case that the target object model 80 is a non-manifold model, the computer program does not recognize the target object model 80 as being three-dimensional. Therefore, conventionally, a target slice image corresponding to the target object model 80 is not created, and thus a desired target slice image is not created. However, in this preferred embodiment, in a case that, for example, there is a ridgeline along which the target object model 80 is divisible in correspondence with the topology groups (i.e., ridge line $E_{11}$), the target object model 80 is divisible into a plurality of divided object models 81*a* and 81*b* along a ridgeline $E_{11}$. Specifically, in this preferred embodiment, the target object model 80 is divided along a ridgeline $E_{11}$, which is in contact with "4" planes. In this example, the post-division models, namely, the first divided object model 81*a* and the second divided object model 81*b*, are made manifold models, which are recognizable by the computer program as being three-dimensional. Therefore, as shown in FIG. 15 and FIG. 16, the first divided slice image 83*a* corresponding to the first divided object model 81*a* and the second divided slice image 83*b* corresponding to the second divided object model 81*b* are created. The first divided slice image 83*a* and the second divided slice image 83*b* are synthesized to create the target slice image 86 shown in FIG. 17. This solves the problem with the conventional art that a contour of a desired target slice model is not extracted because peeling is not performed properly on the target object model. For example, a computation failure caused by peeling, which may sometimes happen in a multiplexed portion where a plurality of contours cross each other is avoided. Therefore, the desired target slice image 86 is obtained.

In this preferred embodiment, in a case that, as shown in FIG. 9, the number of the planes that are in contact with each of all the ridgelines is "2" and there are a plurality of topology groups (in the target object model 80*a* shown in FIG. 9, the number of the topology groups is "2"), the target object model 80*a* is divisible into divided object models of the number of the topology groups, namely, into the first divided object model 80*a*1 and the second divided object model 80*a*2. Therefore, for example, a first divided slice image corresponding to the first divided object model 80*a*1 and a second divided slice image corresponding to the second divided object model 80*a*2 are created, and the created first divided slice image and the created second divided slice image are synthesized to create a target slice image. This solves the problem with the conventional art that a contour of a desired target slice model is not extracted because peeling is not performed properly on the target object model, and a desired target slice image is obtained.

In this preferred embodiment, as shown in FIG. 7, the first divided object model 81*a* and the second divided object model 81*b* are manifold models. Therefore, the first divided slice image 83a (see FIG. 15) corresponding to the first divided object model 81a and the second divided slice image 83b (see FIG. 16) corresponding to the second divided object model 81b are created with more certainty.

Figure 15:
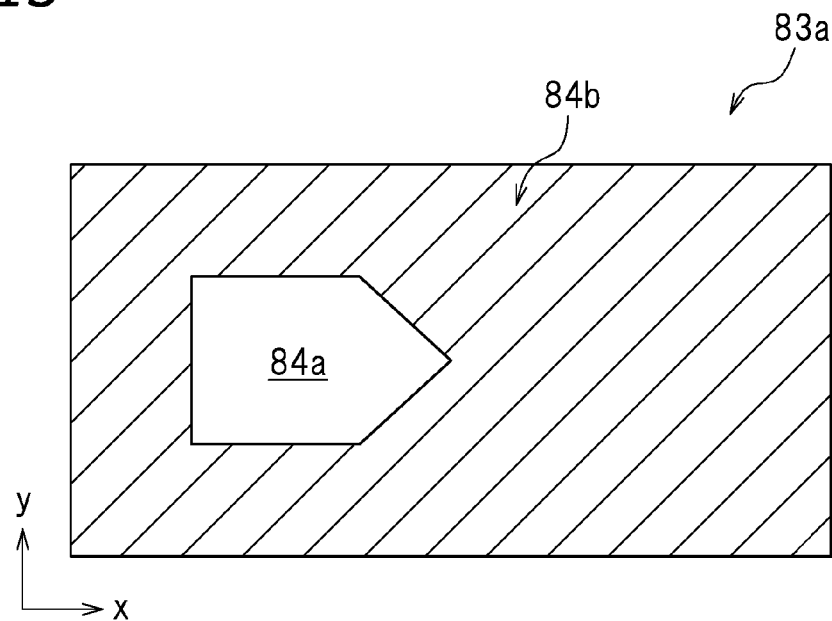
FIG. 15 shows a first divided slice image.
Figure 16:
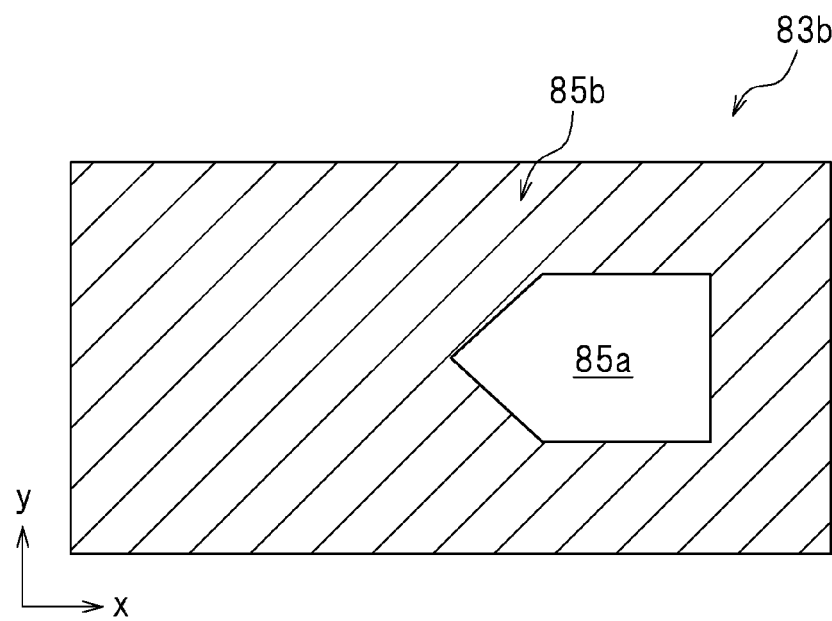
FIG. 16 shows a second divided slice image.

In this preferred embodiment, as shown in FIG. 15 and FIG. 16, the slice image creation processor 62 provides the printing regions 84a and 85a and the non-printing regions 84b and 85b with different colors. As shown in FIG. 17, the synthesis processor 64 provides the printing region 86a and the non-printing region 86b with different colors. In this example, the pixels in the printing regions 84a, 85a and 86a are each colored white, and the pixels in the non-printing regions 84b, 85b and 86b are each colored black. Therefore, the computation of obtaining the target slice image 86 (see FIG. 17) from the first divided slice image 83a (see FIG. 15) and the second divided slice image 83b (see FIG. 16) is a simple computation of merely comparing pixel values of the pixels. This facilitates the computation performed on the printing regions 84a and 85a and the computation performed on the non-printing regions 84b and 85b in the first divided slice image 83a and the second divided slice image 83b, which are pre-division slice images. Therefore, the amount of computation is decreased, and the data capacity is also decreased. This shortens the processing time.

In this preferred embodiment, referring to FIG. 5, the pre-process processor 54 performs the smoothing process as a pre-process on the target object model 80 stored in the storage processor 52. The topology construction processor 56 creates the topology list 90 (see FIG. 8) from the target object model 80 processed by the smoothing process by the pre-process processor 54. The smoothing process performed on the target object model 80 by the pre-process processor 54 decreases the amount of data of the target object model 80. This allows the topology construction processor 56, the division determination processor 58, the division processor 59, the slice model creation processor 60, the slice image creation processor 62 and the synthesis processor 64 to use the target object model 80 having the decreased amount of data done by the pre-process processor 54. This preferably decreases the computation load.

The three-dimensional printing system 10 including the slice image creation device 100 in preferred embodiment 1 has been described. The slice image creation device according to a preferred embodiment of the present invention is not limited to the slice image creation device 100 in preferred embodiment 1, and may be carried out in any of various other forms. Now, another preferred embodiment will be described briefly. In the following description, elements substantially the same as the elements described above will bear the identical reference signs thereto and descriptions thereof will be omitted.

Preferred Embodiment 2

Figure 18:
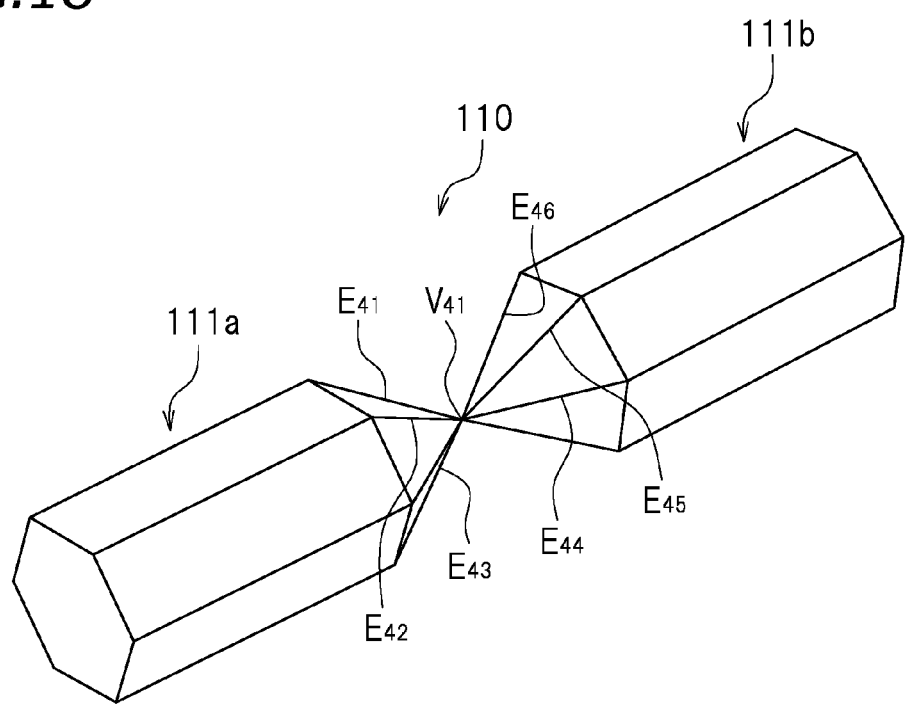
FIG. 18 is a perspective view of a target object model according to preferred embodiment 2 of the present invention.
Figure 19:
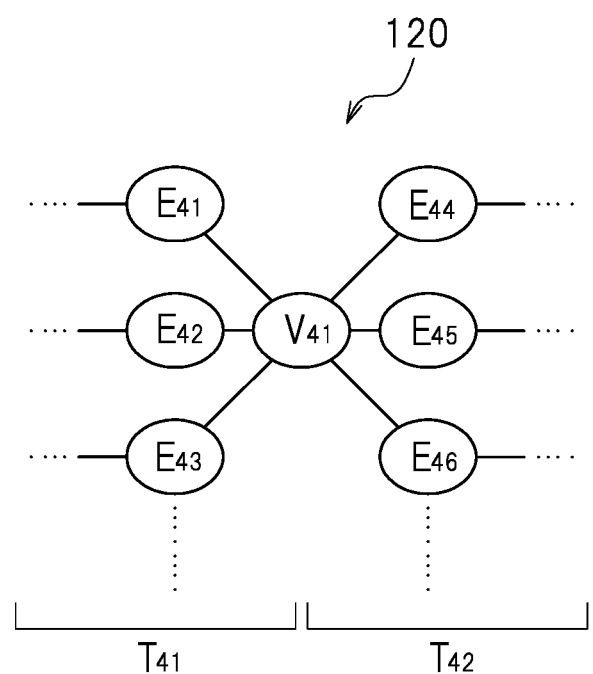
FIG. 19 shows a topology list of the target object model shown in FIG. 18.

FIG. 18 is a perspective view of a target object model 110. FIG. 19 shows a topology list 120 of the target object model 110 shown in FIG. 18. Even the target object model 110 shown in FIG. 18 may be divided into a plurality of divided object models to create target slice images. In this example, a procedure of dividing the target object model 110 will be described.

First, like in step S103 shown in FIG. 6, the division determination processor 58 calculates the number of topology groups from the topology list 120 shown in FIG. 19. The topology list 120 shown in FIG. 19 includes topology groups $T_{41}$ and $T_{42}$. Therefore, the number of the topology groups is "2", namely, there are a plurality of topology groups. The division determination processor 58 determines whether or not there is an apex, among the apexes defining the target object model 110, at which the target object model 110 is divided in correspondence with the topology groups. In this example, as shown in FIG. 19, the target object model 110 is divisible in correspondence with the topology groups $T_{41}$ and $T_{42}$, namely, is divisible into two topology groups, at apex $V_{41}$. Thus, the division processor 59 divides the target object model 110 into a first divided object model 111a and a second divided object model 111b at apex $V_{41}$. In this case, all the ridgelines defining the first divided object model 111a and the second divided object model 111b are each in contact with "2" planes. Namely, the first divided object model 111a and the second divided object model 111b are each a manifold model recognizable by a computer program as being three-dimensional.

Thus, in this preferred embodiment, steps substantially the same as steps S110 through S112 shown in FIG. 6 are performed. Specifically, the slice model creation processor 60 creates first divided slice models and second divided slice models respectively from the first divided object model 111a and the second divided object model 111b. The slice image creation processor 62 creates a first divided slice image from each of the first divided slice models and creates a second divided slice image from each of the second divided slice models. The synthesis processor 64 synthesizes the first divided slice image and the second divided slice image created by the slice image creation processor 62 to create a target slice image.

As described above, in this preferred embodiment, in a case that there are a plurality of topology groups of the target object model 110 (in the target object model 110 shown in FIG. 9, the number of the topology groups is "2") and there is an apex, among the apexes defining the target object model 110, at which the target object model 110 is divisible in correspondence with the topology groups (i.e., apex $V_{41}$), the target object model 110 is divided into a plurality of divided object models at apex $V_{41}$. Therefore, for example, the first divided slice images and the second divided slice images are created respectively from the first divided object model 111a and the second divided object model 111b obtained by the division. Each of the created first divided slice images and a second divided slice image corresponding to the each first divided slice image are synthesized to create a target slice image. This solves the problem with the conventional art that a contour of a desired target slice model is not extracted because peeling is not performed properly on the target object model. Therefore, a desired target slice image is obtained.

As described above, the processors of the slice image creation device 100, namely, the storage processor 52, the pre-process processor 54, the topology construction processor 56, the division determination processor 58, the division processor 59, the slice model creation processor 60, the slice image creation processor 62, and the synthesis processor 64 may be implemented by one processor included in the slice image creation device 100. Alternatively, these processors may be implemented by a plurality of processors. According to a preferred embodiment of the present invention, the expression "is configured or programmed" encompasses executing a computer program stored on a computer. The present invention encompasses a non-transitory computer readable medium having the computer program stored thereon temporarily. The present invention encompasses a circuit having substantially the same function as that of the program to be executed by each of the processors. In this case, the storage processor 52, the pre-process processor 54, the topology construction processor 56, the division determination processor 58, the division processor 59, the slice model creation processor 60, the slice image creation processor 62, and the synthesis processor may be respectively replaced with a storage circuit 52, a pre-process circuit 54, a topology construction circuit 56, a division determination circuit 58, a division circuit 59, a slice model creation circuit 60, a slice image creation circuit 62, and a synthesis circuit 64.

The terms and expressions used herein are for description only and are not to be interpreted in a limited sense. These terms and expressions should be recognized as not excluding any equivalents to the elements shown and described herein and as allowing any modification encompassed in the scope of the claims. The present invention may be embodied in many various forms. This disclosure should be regarded as providing preferred embodiments of the principle of the present invention. These preferred embodiments are provided with the understanding that they are not intended to limit the present invention to the preferred embodiments described in the specification and/or shown in the drawings. The present invention is not limited to the preferred embodiment described herein. The present invention encompasses any of preferred embodiments including equivalent elements, modifications, deletions, combinations, improvements and/or alterations which can be recognized by a person of ordinary skill in the art based on the disclosure. The elements of each claim should be interpreted broadly based on the terms used in the claim, and should not be limited to any of the preferred embodiments described in this specification or used during the prosecution of the present application.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A three-dimensional printing system, comprising:
   a three-dimensional printing device that prints a target object as a printing target; and
   a slice image creation device usable with the three-dimensional printing device that prints the target object, the slice image creation device creating a target slice image usable to print the target object, the slice image creation device comprising:
   a storage circuit configured or programmed to store a target object model as a three-dimensional model corresponding to the target object;
   a topology construction circuit configured or programmed to find an adjacency relationship of apexes, ridgelines and planes defining the target object model to create a topology list indicating the adjacency relationship;
   a division determination circuit configured or programmed to determine, from the topology list, whether or not there is a ridgeline, among the ridgelines of the target object model, that is in contact with 4 planes;
   a division circuit configured or programmed to, in a case that the division determination circuit determines that there is the ridgeline that is in contact with 4 planes, divide the target object model into at least a first divided object model and a second divided object model along the ridgeline that is in contact with 4 planes;
   a slice model creation circuit configured or programmed to slice each of the first divided object model and the second divided object model at a predetermined interval to create a plurality of first divided slice models as slice models of the first divided object model and a plurality of second divided slice models as slice models of the second divided object model;
   a slice image creation circuit configured or programmed to divide a region of each of the first divided slice models and each of the second divided slice models into a divided printing region to be printed by the three-dimensional printing device and a divided non-printing region not to be printed by the three-dimensional printing device to create a first divided slice image as an image of each of the first divided slice models and a second divided slice image as an image of each of the second divided slice models; and
   a synthesis circuit configured or programmed to overlap each of the first divided slice images and the second divided slice image defining a same layer as the each of the first divided slice images, and determine, as a target printing region to be printed by the three-dimensional printing device, a portion of an overlap region corresponding to at least one of a printing region of the first divided slice image or a printing region of the second divided slice image and determine, as a target non-printing region not to be printed by the three-dimensional printing device, a portion of an overlap region corresponding to both of a non-printing region of the first divided slice image and a non-printing region of the second divided slice image, to create the target slice image, wherein
   the three-dimensional printing device is configured to print the target object according to the target printing region and the target non-printing region of the target slice image created by the synthesis circuit.

2. The three-dimensional printing system according to claim 1, wherein the first divided object model and the second divided object model are manifold models.

3. The three-dimensional printing system according to claim 1, wherein:
   the slice image creation circuit colors the divided printing region and the divided non-printing region with different colors from each other; and
   the synthesis circuit colors the target printing region and the target non-printing region with different colors from each other.

4. The three-dimensional printing system according to claim 1, wherein:
   the slice image creation device further includes a pre-process circuit configured or programmed to perform a smoothing process as a pre-process on the target object model stored in the storage circuit; and
   the topology construction circuit creates the topology list from the target object model processed by the smoothing process performed by the pre-process circuit.

5. A three-dimensional printing system, comprising:
   a three-dimensional printing device that prints a target object as a printing object; and
   a slice image creation device usable with the three-dimensional printing device that prints the target object, the slice image creation device creating a target slice image usable to print the target object, the slice image creation device comprising:
   a storage circuit configured or programmed to store a target object model as a three-dimensional model corresponding to the target object;
   a topology construction circuit configured or programmed to find an adjacency relationship of apexes, ridgelines and planes defining the target object model to create a topology list indicating the adjacency relationship;

a division determination circuit configured or programmed to determine whether or not a number of planes that are in contact with each of all of the ridgelines of the target object model is 2;

a division circuit configured or programmed to, in a case that the division determination circuit determines that the number of planes that are in contact with each of all of the ridgelines is 2, calculate a number of topology groups into which the topology list is divisible, and in a case that the topology list is divisible into a plurality of topology groups, divide the target object model into divided object models of the number of the topology groups, with any two of the divided object models being a first divided object model and a second divided object model, respectively;

a slice model creation circuit configured or programmed to slice each of the first divided object model and the second divided object model at a predetermined interval to create a plurality of first divided slice models as slice models of the first divided object model and a plurality of second divided slice models as slice models of the second divided object model;

a slice image creation circuit configured or programmed to divide a region of each of the first divided slice models and each of the second divided slice models into a divided printing region to be printed by the three-dimensional printing device and a divided non-printing region not to be printed by the three-dimensional printing device to create a first divided slice image as an image of each of the first divided slice models and a second divided slice image as an image of each of the second divided slice models; and a synthesis circuit configured or programmed to overlap each of first divided slice images and the second divided slice image defining a same layer as the each of the first divided slice images, and determine, as a target printing region to be printed by the three-dimensional printing device, a portion of an overlap region corresponding to at least one of a printing region of the first divided slice image or a printing region of the second divided slice image and determine, as a target non-printing region not to be printed by the three-dimensional printing device, a portion of an overlap region corresponding to both of a non-printing region of the first divided slice image and a non-printing region of the second divided slice image, to create the target slice image, wherein the three-dimensional printing device is configured to print the target object according to the target printing region and the target non-printing region of the target slice image created by the synthesis circuit.

6. A three-dimensional printing system, comprising:

a three-dimensional printing device that prints a target object as a printing target; and a slice image creation device usable with the three-dimensional printing device that prints the target object, the slice image creation device creating a target slice image usable to print the target object, the slice image creation device comprising:

a storage circuit configured or programmed to store a target object model as a three-dimensional model corresponding to the target object;

a topology construction circuit configured or programmed to find an adjacency relationship of apexes, ridgelines and planes defining the target object model to create a topology list indicating the adjacency relationship;

a division determination circuit configured or programmed to calculate a number of topology groups into which the topology list is divisible, and in a case that the topology list is divisible into a plurality of topology groups, determine whether or not there is an apex, among the apexes of the target object model, at which the target object model is divisible in correspondence with the topology groups;

a division circuit configured or programmed to, in a case that the division determination circuit determines that there is the apex at which the target object model is divisible, divide the target object model into at least a first divided object model and a second divided object model at the apex;

a slice model creation circuit configured or programmed to slice each of the first divided object model and the second divided object model at a predetermined interval to create a plurality of first divided slice models as slice models of the first divided object model and a plurality of second divided slice models as slice models of the second divided object model;

a slice image creation circuit configured or programmed to divide a region of each of the first divided slice models and each of the second divided slice models into a divided printing region to be printed by the three-dimensional printing device and a divided non-printing region not to be printed by the three-dimensional printing device to create a first divided slice image as an image of each of the first divided slice models and a second divided slice image as an image of each of the second divided slice models; and a synthesis circuit configured or programmed to overlap each of first divided slice images and the second divided slice image defining a same layer as the each of the first divided slice images, and determine, as a target printing region to be printed by the three-dimensional printing device, a portion of an overlap region corresponding to at least one of a printing region of the first divided slice image or a printing region of the second divided slice image and determine, as a target non-printing region not to be printed by the three-dimensional printing device, a portion of an overlap region corresponding to both of a non-printing region of the first divided slice image and a non-printing region of the second divided slice image, to create the target slice image, wherein the three-dimensional printing device is configured to print the target object according to the target printing region and the target non-printing region of the target slice image created by the synthesis circuit.

* * * * *